United States Patent
Jung et al.

(10) Patent No.: US 9,071,239 B2
(45) Date of Patent: Jun. 30, 2015

(54) METHOD AND SEMICONDUCTOR APPARATUS FOR REDUCING POWER WHEN TRANSMITTING DATA BETWEEN DEVICES IN THE SEMICONDUCTOR APPARATUS

(71) Applicant: QUALCOMM Incorporated, San Diego, CA (US)

(72) Inventors: Chulmin Jung, San Diego, CA (US); Sei Seung Yoon, San Diego, CA (US); Esin Terzioglu, San Diego, CA (US); Hari Ananthanarayanan, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/799,686

(22) Filed: Mar. 13, 2013

(65) Prior Publication Data

US 2014/0266398 A1   Sep. 18, 2014

(51) Int. Cl.
*H03K 17/00* (2006.01)
*G11C 7/10* (2006.01)
*G11C 7/02* (2006.01)

(52) U.S. Cl.
CPC ............ *H03K 17/002* (2013.01); *G11C 7/02* (2013.01); *G11C 7/10* (2013.01); *G11C 7/1006* (2013.01)
USPC .......................................... 327/403; 327/407

(58) Field of Classification Search
None
See application file for complete search history.

(56) References Cited

U.S. PATENT DOCUMENTS

| 5,737,141 | A | * | 4/1998 | Hardwick et al. ............. 360/45 |
| 6,127,864 | A | * | 10/2000 | Mavis et al. .................. 327/144 |
| 6,593,867 | B2 | | 7/2003 | Nguyen |
| 6,813,700 | B2 | | 11/2004 | Fallah et al. |
| 7,359,471 | B2 | | 4/2008 | Okuda et al. |
| 8,274,311 | B2 | | 9/2012 | Liu |
| 2002/0019896 | A1 | | 2/2002 | Fornaciari et al. |
| 2008/0056345 | A1 | | 3/2008 | Kim et al. |
| 2009/0180337 | A1 | | 7/2009 | Nakanishi et al. |
| 2010/0002778 | A1 | | 1/2010 | Amada et al. |

OTHER PUBLICATIONS

International Search Report and Written Opinion for PCT/US2014/022110 dated Jul. 11, 2014.

* cited by examiner

*Primary Examiner* — Cassandra Cox
(74) *Attorney, Agent, or Firm* — Haynes and Boone, LLP

(57) ABSTRACT

A semiconductor apparatus is provided herein for reducing power when transmitting data between a first device and a second device in the semiconductor apparatus. Additional circuitry is added to the semiconductor apparatus to create a communication system that decreases a number of state changes for each signal line of a data bus between the first device and the second device for all communications. The additional circuitry includes a decoder coupled to receive and convert a value from the first device for transmission over the data bus to an encoder that provides a recovered (i.e., re-encoded) version of the value to the second device. One or more multiplexers may also be included in the additional circuitry to support any number of devices.

36 Claims, 8 Drawing Sheets

FIG. 7

| DQ<0> | DQ<1> | DQ<2> | A<7> | A<6> | A<5> | A<4> | A<3> | A<2> | A<1> | A<0> |
|---|---|---|---|---|---|---|---|---|---|---|
| 0 | 0 | 0 | S | S | S | S | S | S | S | T |
| 0 | 0 | 1 | S | S | S | S | S | S | T | S |
| 0 | 1 | 0 | S | S | S | S | S | T | S | S |
| 0 | 1 | 1 | S | S | S | S | T | S | S | S |
| 1 | 0 | 0 | S | S | S | T | S | S | S | S |
| 1 | 0 | 1 | S | S | T | S | S | S | S | S |
| 1 | 1 | 0 | S | T | S | S | S | S | S | S |
| 1 | 1 | 1 | T | S | S | S | S | S | S | S |

METHOD AND SEMICONDUCTOR APPARATUS FOR REDUCING POWER WHEN TRANSMITTING DATA BETWEEN DEVICES IN THE SEMICONDUCTOR APPARATUS

FIELD

The present disclosure pertains to integrated circuit design and layout. Specifically, the present disclosure is directed to reducing power when transmitting data between devices in a semiconductor apparatus.

BACKGROUND

High density memory systems such as cache systems in semiconductor apparatuses consume large amounts of power when transmitting data over signal lines as a result of capacitive loading on those signal lines. For example, a single logical (or memory) bank in a high density cache system of a semiconductor apparatus may include 16 megabytes (MB) of memory comprising 32 macros (or collections) of 512K Static Random Access Memory (SRAM). The power consumed when transmitting data across the signal lines with 32 macros is almost four times greater than the dynamic operating power of 1 macro.

FIG. 1 is a block diagram illustrating the transmission of data between two devices in a typical semiconductor apparatus, such as a system on a chip (SoC). As shown, a data bus 104 is disposed between a first device such as a memory device 102, and a second device such as a processor 106. Output from the memory device 102 is transmitted to the processor 106 via the data bus 104, which as illustrated is a 3-bit data bus having a set of signal lines 124—one for each of the 3-bits (D<0:2>). The data bus 104 may include repeaters such as a set of buffers 122 to regenerate signals on each of the set of signal lines 122 of the data bus 104.

One problem associated with the layout of the devices in FIG. 1 is that if each signal line of the set of signal lines 122 in the data bus 104 is not sufficiently spaced apart, their close proximity to each other will cause interference and crosstalk on the signal lines that will distort and cause error in the transmitted data. As a result, more space is typically allocated in the semiconductor apparatus to position the signal lines, with a tradeoff of having reduced usable space in exchange for reduced errors.

Another problem associated with the layout of the devices in FIG. 1 is that interference and crosstalk on the set of signal lines 122 can cause the communicated data to randomly change. For example, the communicated data can randomly change from 000 to 111, or any combination in between as one or more of set of signal lines 122 in the data bus 104 may randomly change state from 0 to 1 or from 1 to 0.

Power is consumed each time one of the set of signal lines 122 changes state, such as when a state changes from 0 to 1, because the signal line needs to be driven to an opposite state. In the architecture of FIG. 1, to communicate a series of 3-bit words, an average of 1.5 bits of the 3 bits will change state because a change from one word to another requires at least one bit to change. Consequently, a significant amount of power is consumed during the transmission of data directly over the set of signal lines 122 of the data bus 104 as shown in FIG. 1.

Accordingly, there is a need for an approach for reducing power when transmitting data between devices in a semiconductor apparatus.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, a semiconductor apparatus for reducing power when transmitting data between devices in the semiconductor apparatus is provided. The semiconductor apparatus comprises an input bus configured to receive an encoded input from a first device; an output bus comprising a set of output signal lines, wherein each output signal line represents a decoded value of the encoded input; and a toggle decoder coupled to the input bus and the output bus, and configured to toggle one of the output signal lines based on the decoded value. Each output signal line comprises a state, and the toggle decoder is configured to change the state of at most one of the output signal lines based on the decoded value at every operation cycle. The toggle decoder can also maintain the state of each output signal line to represent one of the decoded values. The input bus may comprise a set of input signal lines and the set of output signal lines may comprise a larger number of signal lines than the set of input signal lines.

One or more multiplexers may be configured to receive output from the toggle decoder to allow selection and output of a set of decoded value. A toggle encoder may be coupled to the one or more multiplexers and configured to receive the set of decoded values from the one or more multiplexers and generate an encoded output based on the set of decoded values. The selection of which set of signals to receive is controlled by a second device, the second device coupled to the toggle encoder and configured to receive the encoded output.

In another aspect, a method for reducing power when transmitting data between devices in the semiconductor apparatus is provided. The method includes receiving an encoded input from a first device over an input bus; communicating a decoded value of the encoded input using an output bus comprising a set of output signal lines, wherein each output signal line represents a decoded value of the encoded input; and toggling one of the output signal lines on the set of output signal lines based on the decoded value. The method further includes receiving a decoded output, the decoded output allowing selection and output of a set of decoded values; receiving the set of decoded values; and generating an encoded output based on the set of decoded values, the encoded output received by a second device which controls the selection of which set of signals to receive.

In yet another aspect, a semiconductor apparatus that includes means for reducing power when transmitting data between devices in the semiconductor apparatus is provided. The semiconductor apparatus includes means for receiving an encoded input from a first device over an input bus; means for communicating a decoded value of the encoded input using an output bus comprising a set of output signal lines, wherein each output signal line represents a decoded value of the encoded input; and means for toggling one output signal line on the set of output signal lines based on the decoded value. The semiconductor apparatus further includes means for receiving a decoded output, the decoded output allowing selection and output of a set of decoded values; means for receiving the set of decoded values; and means for generating an encoded output based on the set of decoded values, the encoded output received by a second device which controls the selection of which set of signals to receive.

These and other aspects of the disclosure will become more fully understood upon a review of the detailed description, which follows.

DRAWINGS

Various features, nature and advantages may become apparent from the detailed description set forth below when taken in conjunction with the drawings in which like reference characters identify correspondingly throughout.

FIG. 7 illustrates a table of possible permutations of the output of a decoder having a 3-bit input.

DETAILED DESCRIPTION

Figure 1:
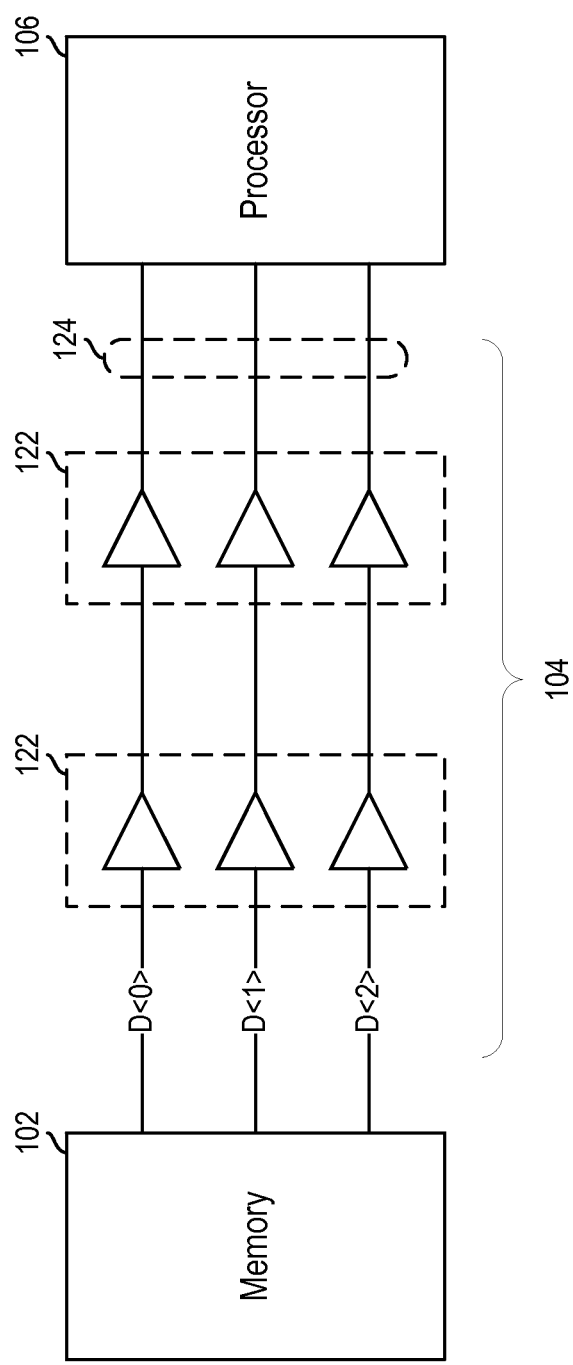
FIG. 1 is a block diagram illustrating the transmission of data between two devices in a typical semiconductor apparatus.

Various aspects of an approach for reducing power consumption when transmitting data between a first device and a second device in a semiconductor apparatus are disclosed herein. As described below, one approach for reducing power consumption includes adding circuitry to the semiconductor apparatus to create a communication system that decreases a number of state changes for each signal line of a data bus between the first device and the second device for communications. The additional circuitry includes a decoder coupled to receive and convert an encoded value from the first device for transmission over the data bus to an encoder that provides a recovered (i.e., re-encoded) version of the value to the second device. One or more multiplexers may also be included in the additional circuitry to support any number of devices.

In accordance with various aspects of the disclosed approach, the first device may output encoded data, such as data words in base-2 format, to the decoder coupled to the data bus. The decoder may receive the encoded data from the first device and communicate a decoded value over the data bus. The decoded output may comprise a decimal value of the encoded input.

In one aspect of the disclosed approach, the data bus may include a number of signal lines, each of which may correspond to a possible decoded value of the encoded data. A state of one of the output signal lines of the decoder may be changed to signal the decoded value determined by the decoder from the encoded data. Specifically, a state on the selected signal line may be changed either from 1 to 0, or from 0 to 1 while the data on the other output signal lines are identified as having remained unchanged. As used herein, a change in state of a signal line may be referred to as the state or signal line being a "toggle" (T), while no change in state of the signal line may be referred to as the state or signal line as being a "stay" (S).

In accordance with another aspect of the disclosed approach, the encoder is coupled to the data bus to receive a communication of the decoded value from the decoder, and re-encode the received communication for output to the second device. In one aspect of the disclosed approach, the encoder may detect the decoded value based on determining a change in state to one of the output signal lines (toggle) from the decoder based on the decoded value.

Optionally, one or more multiplexers may be used where there are multiple devices that need to be coupled to the data bus, each device outputting encoded data to an associated decoder, the one or more multiplexers coupling an output of a selected associated decoder to the data bus. A single decoder may also be coupled to a multiplexor to support decoding of output from multiple devices. This one set of decoded signals may then be provided as input to the encoder for encoding into encoded data. The encoded data may then be provided as the input into another device. Although adding additional circuitry reduces available space within the semiconductor apparatus, and may seem counterintuitive as a desirable goal is typically to reduce, not add to, a number of circuits in a system, reduction in power consumption that is created outweighs a loss of available space.

Although the following example is illustrated with devices utilizing 3-bit data buses for input and output of data, this is by way of example only. The devices may utilize data buses capable of receiving and transmitting data having more than 3-bits or fewer than 3-bits. In one aspect of the disclosed approach, the data bus has a number of signal lines with a one-to-one correspondence to the output of possible decoded values of the encoded data from the decoder. For example, where the 3-bit data bus is used, eight (8) possible values may be represented. Thus, the data bus may include 8 signal lines. In another aspect of the disclosed approach, the data bus may be configured with a number of signal lines that does not have a one-to-one correspondence to the output of possible decoded values of the encoded data. For example, the number may be smaller than the total output of possible decoded values.

Figure 2:
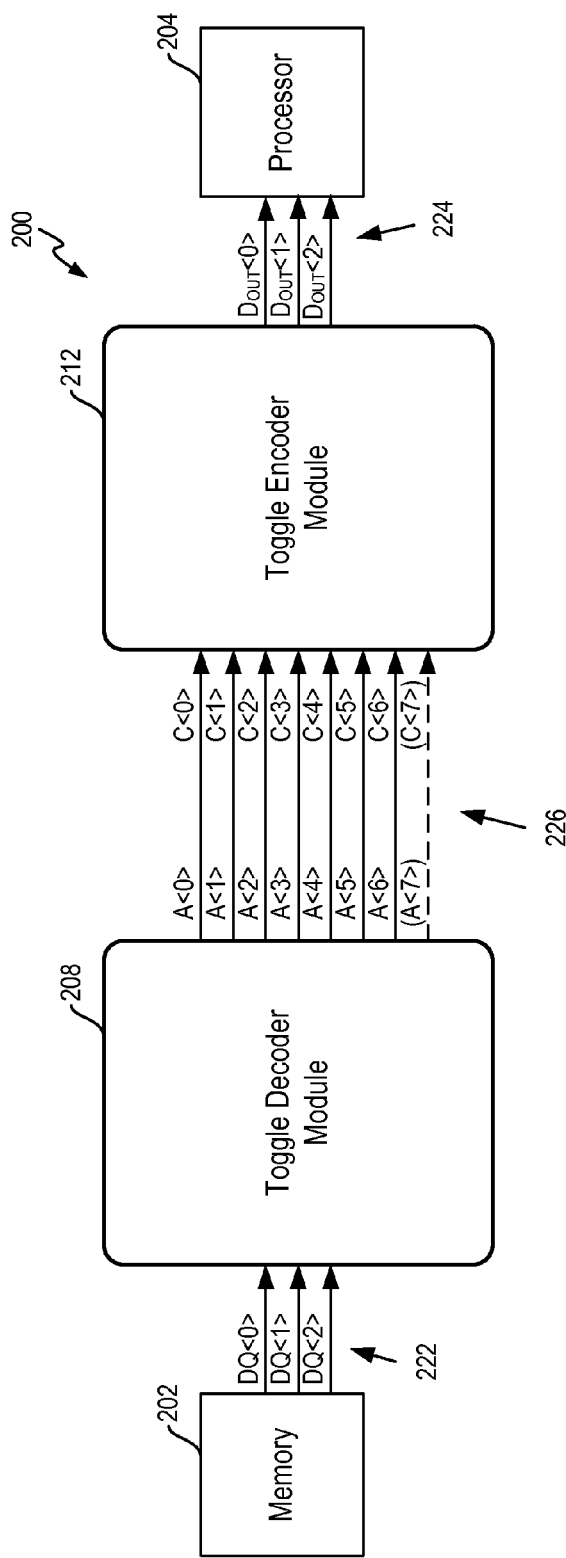
FIG. 2 illustrates a communication system illustrating transmission of data between a first device and a second device, as configured in accordance with one aspect of a disclosed approach for reducing power consumption in a semiconductor apparatus.

FIG. 2 illustrates a communication system 200 illustrating transmission of data between a first device and a second device, as configured in accordance with one aspect of a disclosed approach for reducing power consumption in a semiconductor apparatus. According to one implementation, the first device may be a memory device 202, and the second device may be a processor 204.

As shown, a decoder-side data bus 222 may be used to couple communication of data from the memory device 202 to a toggle decoder module 208. In one aspect of the disclosed approach, the decoder-side data bus 222 is a 3-bit data bus DQ<0:2> and the data output from the memory device 202. This data is provided the toggle decoder module 208 that then provides an 8-bit output A<0:7> that may be transmitted over eight (8) signal lines such as those in a set of signal lines 226 to a toggle encoder module 212. In one aspect of the disclosed approach, the toggle decoder module 208 may be configured to decode multi-bit data from a binary-encoded scheme to a decoded scheme before transmission over the set of signal lines 226. The toggle encoder module 212 may then re-encode that data from the decoded scheme into the binary-encoded scheme once it receives the data from the set of signal lines 226 and provide the re-encoded data to the processor 204 over an encoder-side data bus 224. For example, the toggle decoder module 208 may include a 3-line to 8-line decoder to decode a binary-encoded value received in 3 bits DQ<0:2>, while the toggle encoder module 212 may include an 8-line to 3-line encoder to re-encode the data into the binary-encoded value.

In one aspect of the disclosed approach, a multi-bit data value may be signaled from the toggle decoder module 208 to the toggle encoder module 212 during each operation cycle by first determining which particular signal line in the 8 signal lines 226 is to be toggled. Each operation cycle may correspond to a clock cycle for the system. In one aspect of the disclosed approach, during each clock cycle only one (1) of the eight (8) signal lines 226 may be toggled either from having a high logic state ("1") to a low logic state ("0") or from a low logic state to a high logic state. As noted above, each change or act of changing a state of a signal line may be defined as a "toggle," whereas a "stay" refers to a signal line that is not toggled. In other words, "toggle" refers to a change in state of the signal line and "stay" refers to the state of the signal line remaining unchanged, generally.

In one aspect of the disclosed approach, where each possible decoded value is assigned to a particular signal line, a decoded value may be signaled in that clock cycle by the toggle decoder module 208 toggling a corresponding signal line. For example, the toggle decoder module 208 may signal the value "3" by toggling the signal line associated with that value. If signal line A<2> is assigned to signal the value "3," then the state of that signal line may be changed (toggled) while the states of all other signal lines remain unchanged (stayed). Furthermore, in another aspect of the disclosure, one (1) of the eight (8) signal lines (or output bits) A<0:7> of the toggle decoder module 208 may be eliminated as being redundant as it may be possible to detect a decoded value by determining that none of the signal lines have been toggled. In yet another aspect of the disclosed approach, either a change in state of one of the signal lines or the unchanged state may be assigned to signal a value that may or may not be related to the decoded value. For example, an unchanged state may represent a control signal or error value, such as a read error from the memory device 202.

Although various aspects of the disclosed approach may be described as using all signal lines, such as all signal lines A<0:7> of the 8 signal lines 226, it should be noted that it may be preferable to assign the unchanged state to one of the possible decoded values. This would allow a savings in space in the semiconductor apparatus as it does not need to include circuitry to support all eight signal lines, such as if only seven (7) data lines are implemented in the semiconductor apparatus. For example, circuitry that may be needed to support the eliminated signal line in the toggle decoder module 208, the toggle encoder module 212, and the toggle MUX module 210, as well as a signal path necessary to route the eliminated signal line, may be eliminated. In many of the figures these elements may be shown with dashed lines. Further, the optional signal line may be labeled with parentheses surrounding the exemplary optional signal line. For example, in FIG. 2, the notation "A<0:6(7)>" means that signal lines for A<0>—A<6> are used, while the signal line for A<7> may be optional. Similarly, the notation "(A<7>)" also means that the signal line for A<7> may be optional, regardless of the other signal lines. Further, the same notation may be used to label other sets of data lines, such as a set of output data lines for another toggle decoder module labeled B<0:6(7)>, as further illustrated herein, where a signal line associated with B<7> is optional as an unchanged state is being used to signal a decoded value not associated with the other signal lines that are being used (i.e., B<0>-B<6>).

Continuing with the example using the 3-bit encoded value, possible encoded input values DQ<0:2> for the toggle decoder module 208 are 000, 001, 010, 011, 100, 101, 110, and 111, which correspond to signal lines (or output bits) A<0:7>, respectively. As illustrated in Table 1 below, for example, if the signal line A<1> is toggled during a clock cycle, it is known that the encoded data input DQ<0:2> is 001, if the decoded data output bit A<2> is toggled during a clock cycle, it is known that the encoded data input DQ<0:2> received by the toggle decoder module 208 from the memory device 202 is 010, etc. As noted above, a change in state of a signal line may be referred to as a toggling ("T") of the state, while no change in state of the signal line may be referred to as a stay ("S") of the signal line. Another representation of what is shown in Table 1 may be seen in FIG. 7.

TABLE 1

| Data Input Bits (DQ<0:2>) | Toggled Data Output Bit |
| --- | --- |
| 000 | A<0> |
| 001 | A<1> |
| 010 | A<2> |
| 011 | A<3> |
| 100 | A<4> |
| 101 | A<5> |
| 110 | A<6> |
| 111 | [No Change] or [A<7>] |

In one aspect of the disclosed approach, where one of the decoded values is assigned to a no-toggle (all "stay") state, if none of the signal lines are toggled during a clock cycle, it may be concluded that the encoded data input is 111. Specifically, in this example, if the encoded data is 111, all signal lines may remain in their current state regardless of whether their state is a "1" or "0." It should be noted that the all stay state may be associated with, and thereby used to communicate, any of the possible output decoded values.

The output of the toggle decoder module 208 is determined by which one of the signal lines should change states, either from 0 to 1, or from 1 to 0. As discussed, only one of the signal lines may change state, and as only one of the lines changes, the toggle encoder module 212 can determine which lines was changed or toggled during the clock cycle. Because only one signal line will be toggled during each clock cycle, less power is being consumed as compared to the typical layout as described above with reference to FIG. 1. Specifically, unlike the average of 1.5 signal line changes in the example of a 3-bit data bus, at most only one line may change, resulting in an average of at least one-third power savings. Thus, although additional circuitry has been added to the semiconductor apparatus to support the various aspects of the disclosed approach, in general power saving may be achieved. In one aspect, to realize the power savings, the length of the signal lines in the set of signal lines 226 may be significantly longer than the lengths of the decoder-side data bus 222 and the encoder-side data bus 224.

Figure 3:
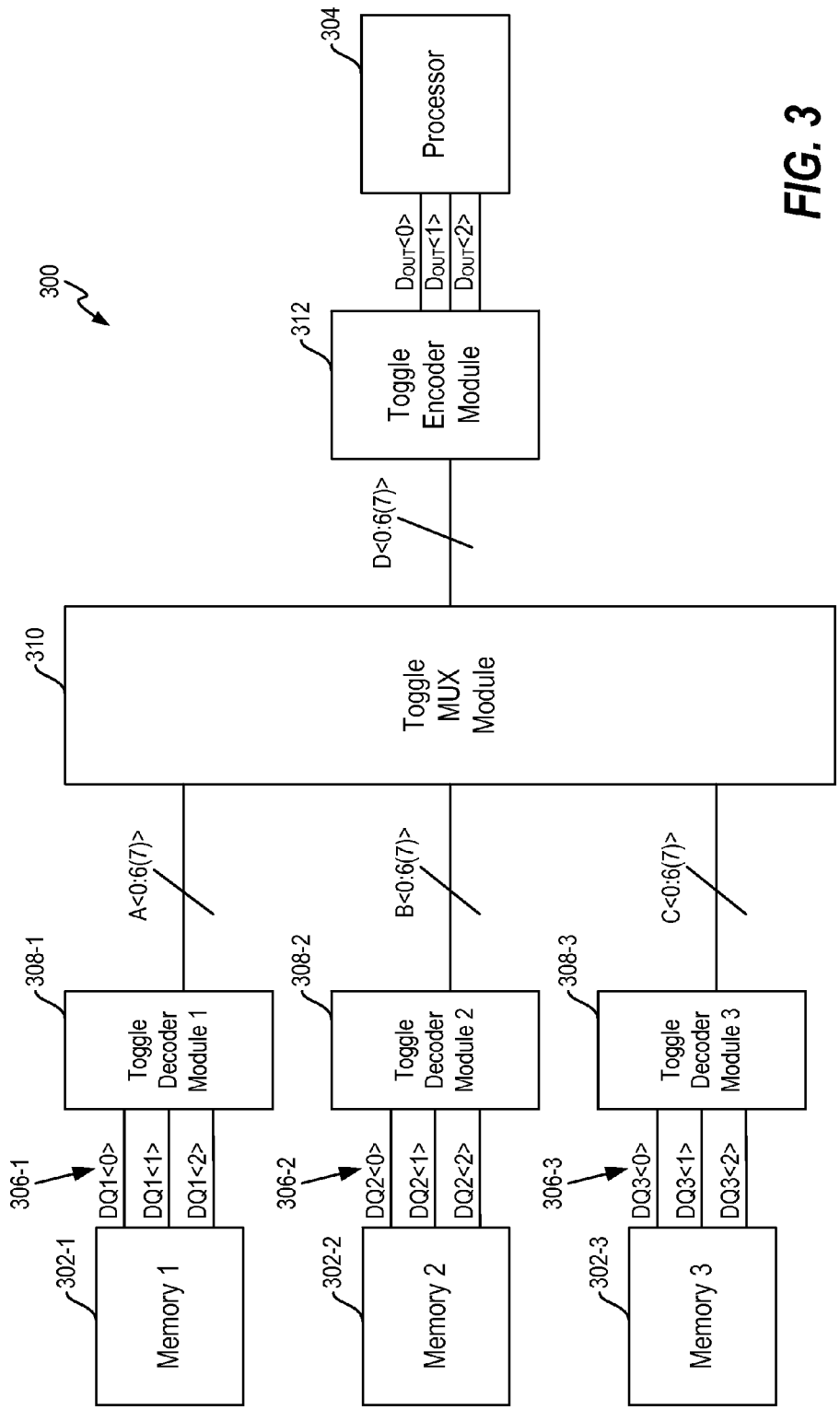
FIG. 3 illustrates a communication system illustrating the transmission of data from multiple devices, each with an associated toggle decoder module, which may be coupled to a toggle encoder module using a toggle multiplexer (MUX) module, to a single device, as configured in accordance with one aspect of a disclosed approach for reducing power consumption in a semiconductor apparatus.

FIG. 3 illustrates a communication system 300 illustrating the transmission of data from multiple devices, each with an associated toggle decoder module, which may be coupled to a toggle encoder module using a toggle multiplexer (MUX) module, to a single device, as configured in accordance with one aspect of a disclosed approach for reducing power consumption in a semiconductor apparatus. According to one implementation, the multiple devices may be memory devices 302-1,3, and the single device may be a processor 304. Although three (3) memory devices 302-1,3 are shown, this is by way of example only. The communication system may be capable of transmitting data from more than three (3) devices or fewer than three (3) devices.

As shown, each of the multiple memory devices 302-1,3 is associated with a toggle decoder module 308-1,3 that may be coupled to a toggle encoder module 312 using a toggle multiplexer (MUX) module 310. Each one of the memory devices 302-1,3 may be coupled to a corresponding 3-bit data bus 306-1,3 (DQ 1<0:2>-DQ3<0:2>) for communicating data to a corresponding toggle decoder module 308-1,3—each of which includes a 3-line to 8-line decoder. In one aspect of the disclosed approach, an output of each of the memory devices 302-1,3 may provide 3 bits of the output data to each of the toggle decoder modules 308-1,3, respectively. Each of the toggle decoder modules 308-1,3 may then provide an 8-bit output that may be transmitted over eight (8) signal lines.

For example, a first toggle decoder module 308-1 having a set of output signal lines A<0:6(7)>, a second toggle decoder module 308-2 having a set of output signal lines B<0:6(7)> and a third toggle decoder module 308-3 having a set of output signal lines C<0:6(7)> may be coupled to the toggle MUX module 310. The toggle MUX module 310 may select one of the sets of output signal lines A<0:6(7)>, B<0:6(7)> or C<0:6(7)> for output as signal lines D<0:6(7)> to a toggle encoder module 312. In accordance with various aspects of the disclosed approach, one or more multiplexers may be used to aggregate all output from multiple toggle decoder modules 308-1,3 to allow selection and output of a desired set of decoded values. The selection of which set of signals to be received from the toggle MUX module 310 may be controlled by the CPU 304 or another controller.

In another aspect of the disclosed approach, as toggle MUX module 310 is placed on the input side of the data bus, the use of toggle MUX module 310 may allow reuse of the signal lines originally only used for A<0:6(7)>because those same signal lines may now be used to transmit the decoded values from any number of toggle decoder modules. That is, instead of a separate set of lines (A<0:6(7)>, B<0:6(7)> and C<0:6(7)>) for each of the toggle decoder modules 308-1,3, the use of toggle MUX module 310 may allow each of the toggle decoder modules 308-1,3 to share one set of lines D<0:6(7)>. However, other multiplexer modules similar to the toggle MUX module 310 may be placed as desired, and used to multiplex a variety of devices, such as where more than one toggle encoder module 312 may be used.

The decoded results from the toggle decoder modules 308-1,3 or the toggle MUX module 310 may be provided to a toggle encoder module 312. The toggle encoder module 312 may detect the decoded results by determining which, if any, signal lines has experienced a state change. Once it has determined the decoded value, the toggle encoder module 312 may generate an encoded output based on the detected decoded value, which in the examples used herein is a 3-bit encoded value. The re-encoded data may then be provided to the CPU 304.

Figure 4:
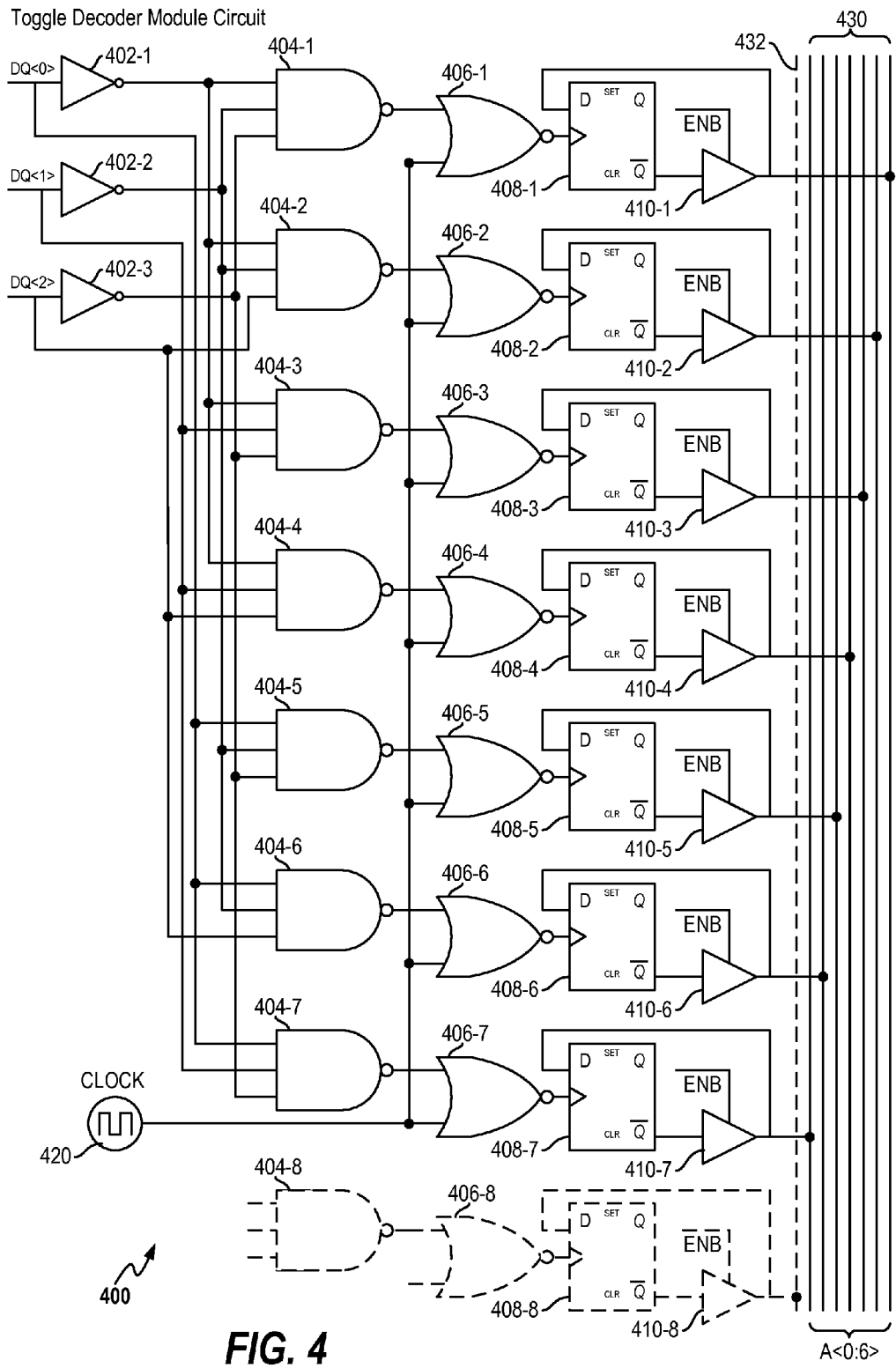
FIG. 4 illustrates a toggle decoder module circuit that may be used to implement the toggle decoder module, which includes a plurality of inverters to receive a plurality of encoded values from a device such as the memory.

FIG. 4 illustrates a toggle decoder module circuit 400 that may be used to implement the toggle decoder module 208, which includes a plurality of inverters 402-1,3 to receive a plurality of encoded values from a device such as the memory 202. For example, the plurality of inverters 402-1,3 may receive an encoded value DQ<0:2> and those values may be coupled to a logic circuit including a plurality of NAND gates 404-1,8 configured appropriately to decode the encoded values and with an output sent to a plurality of NOR gates 406-1,8. Each one of the plurality of NOR gates 406-1,8 may be coupled to a storage device such as a plurality of FLIP-FLOPs 408-1,8, where the NOR gates are coupled to the plurality of NAND gates 404-1,8, to control transfer of data based on a timing signal received from a clock 420. In one aspect of the disclosed approach, a decoded value is output during each clock cycle. Thus, the signal received from the clock allows the NOR gates 406-1,8 to pass a value from one of the plurality of NAND gates 404-1,8 to a respective FLIP-FLOP in the plurality of FLIP-FLOPs 408-1,8 that provides an output to a respective buffer in a plurality of buffers 410-1,8. An enable signal may be used to enable the plurality of buffers 410-1,8 so that the decoded value may be output on an output signal line in a set of signal lines A<0,6>430. As illustrated, a signal line 432 may represent the optional signal line, the function of which may be replaced by a stay-all state.

Figure 5:
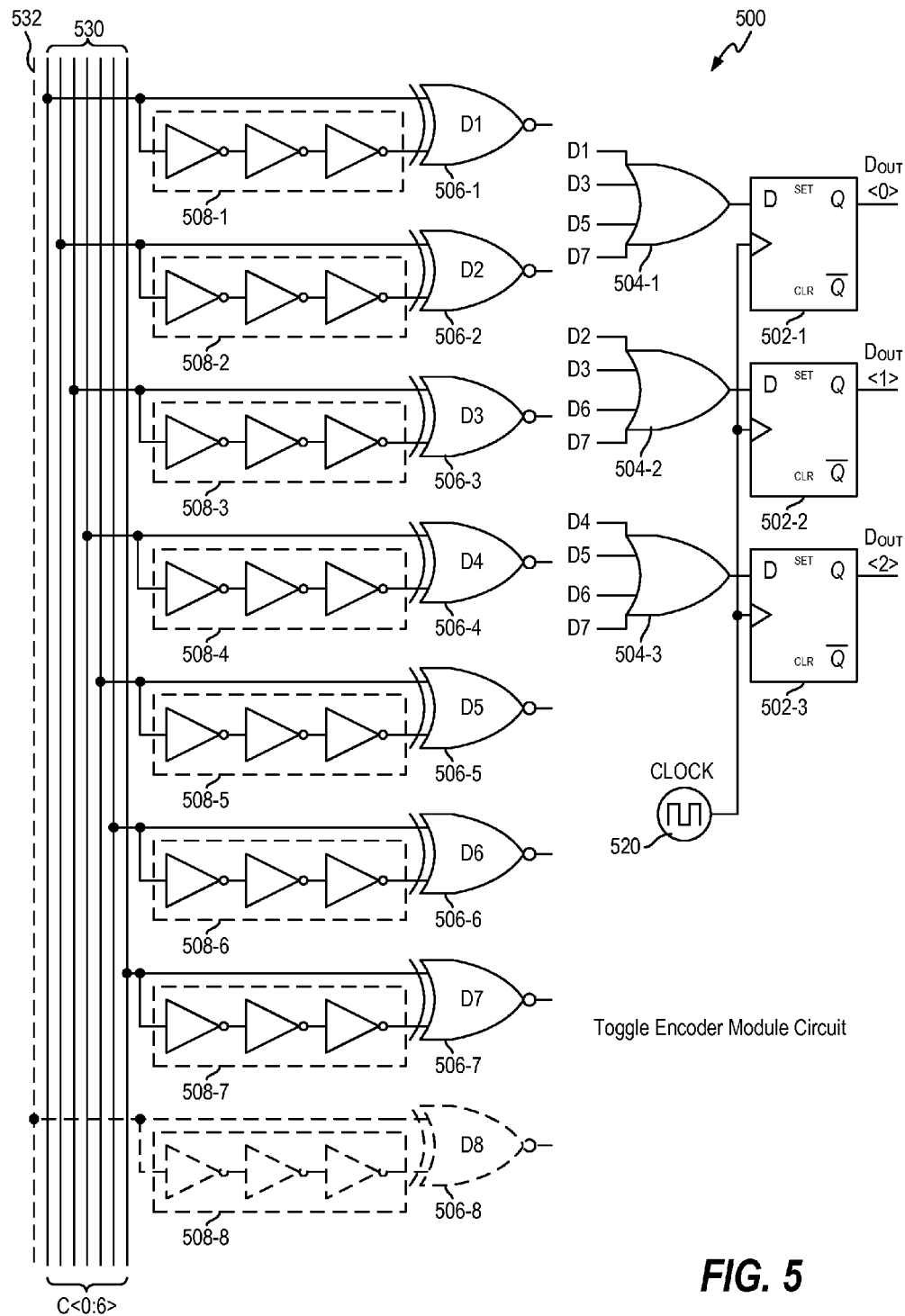
FIG. 5 illustrates a toggle encoder module circuit that may be used to implement the toggle encoder module, which includes a plurality of buffers, each of which is made up of three serially coupled inverters.

FIG. 5 illustrates a toggle encoder module circuit 500 that may be used to implement the toggle encoder module 212, which includes a plurality of buffers 508-1,8, each of which is made up of three serially coupled inverters. Each of the plurality of buffers 508-1,8 is coupled to an input of one of a plurality of XNOR gates 506-1,8. The buffers may be used to hold a value until an appropriate signal is received on one of a plurality of input signal lines C<0:6>530. An optional signal line 532 is illustrated as a dashed line. Outputs of the plurality of XNOR gates 506-1,8 may be coupled to a plurality of OR gates 504-1,3 configured to encode the inputs received from the plurality of input signal lines C<0:6>530 to a corresponding FLIP-FLOP in a plurality of FLIP-FLOPS 502-1,3. Each of the plurality of FLIP-FLOPS 502-1,3 may output a stored value when a signal is received from a clock 520, which as described above is a re-encoded value of the input received at the data bus A<0:6>530 and optionally signal line 532.

Figure 6:
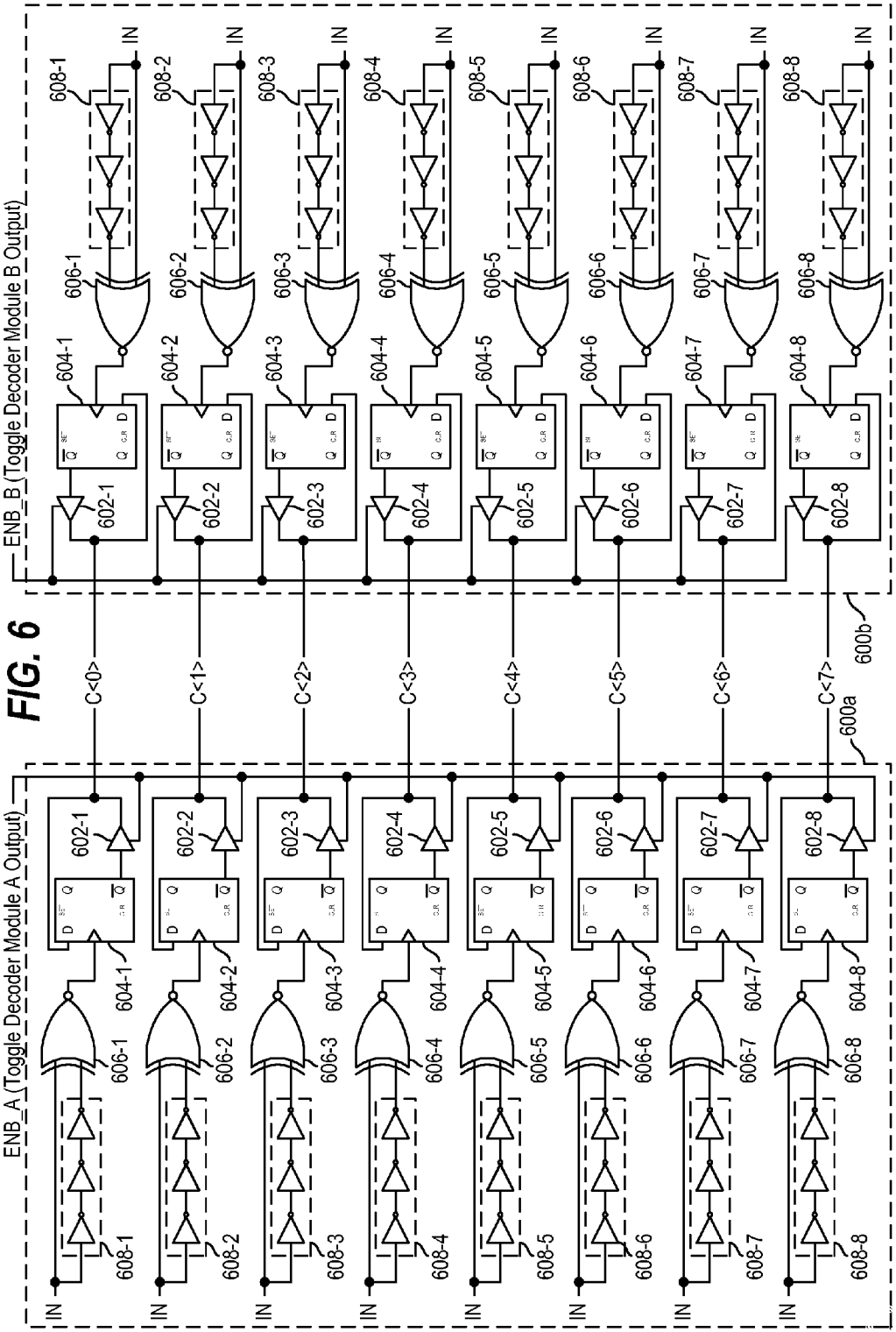
FIG. 6 illustrates a toggle MUX module that receives inputs from two toggle decoder modules and stores in a pair of respective storage circuits.

FIG. 6 illustrates a toggle MUX module that receives inputs from two toggle decoder modules and stores in a pair of respective storage circuits 600a, 600b. Each of the pair of storage circuits 600a, 600b include a plurality of storage buffers 608-1,8 coupled to respective one of a plurality of XNOR gate 606-1,8, which is configured to store an input value and also provide a stored value from one of a plurality of FLIP-FLOPS 604-1,8 based on an enable signal received at a plurality of buffers 602-1,6. For example, an ENB_A signal selects outputs from the plurality of buffers 602-1,8 in the storage circuit 600a while an ENB_B signal selects outputs from the plurality of buffers 602-1,8 in the storage circuit 600b.

Figure 8:
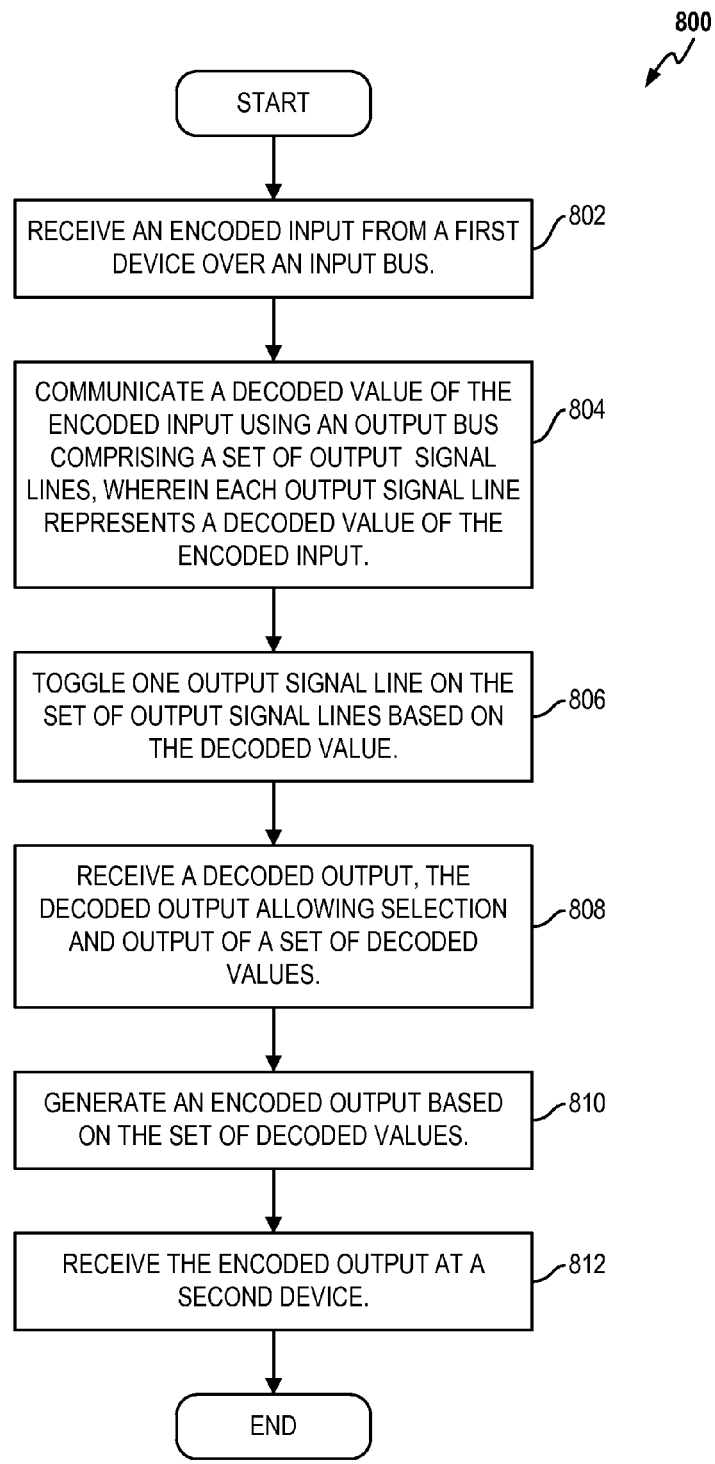
FIG. 8 illustrates a method for reducing power when transmitting data between devices in a semiconductor apparatus.

FIG. 8 illustrates a method 800 for reducing power when transmitting data between devices in a semiconductor apparatus. An encoded input may be received from a first device over an input bus, wherein the input bus comprises a set of input signal lines 802. A decoded value of the encoded input may then be communicated using an output bus comprising a set of output signal lines, wherein each output signal line represents a decoded value of the encoded input 804. Next, one output signal line on the set of output signal lines may be toggled based on the decoded value 806 causing a decoded output to be received on the set of output signal lines allowing for the selection and output of a set of decoded values 808. An encoded output based on the set of decoded values may then be generated 810 and received by a second device 812.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

One or more of the components, steps, features and/or functions illustrated in the FIGS. may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGS. may be configured to perform one or more of the methods, features, or steps described in the FIGS. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the disclosed approach described herein can be implemented in different systems without departing from the novel aspects of the disclosed approach. It should be noted that the foregoing embodiments are merely examples and are not to be construed as limiting the disclosed approach. The description of the embodiments is intended to be illustrative, and not to limit the scope of the claims. As such, the present teachings can be readily applied to other types of apparatuses and many alternatives, modifications, and variations will be apparent to those skilled in the art.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A semiconductor apparatus, comprising:
    an input bus configured to receive an encoded input from a first device;
    an output bus comprising a set of output signal lines, wherein each of the output signal lines represents a decoded value of the encoded input; and
    a toggle decoder coupled to the input bus and the output bus, and configured to toggle at most one of the output signal lines based on the decoded value.

2. The semiconductor apparatus of claim 1, wherein each of the output signal lines comprises a state, and the toggle decoder is configured to change the state of at most one of the output signal lines based on the decoded value at each operation cycle.

3. The semiconductor apparatus of claim 2, wherein an additional decoded value corresponds to the toggle decoder toggling the state of none of the output signal lines during a respective operation cycle.

4. The semiconductor apparatus of claim 1, wherein the input bus comprises a set of input signal lines, and wherein the set of output signal lines comprises a larger number of signal lines than the set of input signal lines.

5. The semiconductor apparatus of claim 1, wherein the toggle decoder is configured to output the decoded value at each operation cycle.

6. The semiconductor apparatus of claim 1, wherein the encoded input comprises a base-2 encoding of a value output from the first device.

7. The semiconductor apparatus of claim 5, wherein the decoded output comprises a decimal value of the encoded input.

8. The semiconductor apparatus of claim 1, further comprising:
    one or more multiplexers configured to receive output from the toggle decoder to allow selection and output of a set of decoded values.

9. The semiconductor apparatus of claim 8, further comprising:
    a toggle encoder coupled to the one or more multiplexers and configured to receive the set of decoded values from the one or more multiplexers and generate an encoded output based on the set of decoded values.

10. The semiconductor apparatus of claim 9, further comprising a second device coupled to the toggle encoder, the second device configured to receive the encoded output and to select which set of signals to receive.

11. The semiconductor apparatus of claim 10, wherein the first device is a memory device.

12. The semiconductor apparatus of claim 10, wherein the second device is a central processing unit.

13. A method for reducing power when transmitting data between devices in a semiconductor apparatus, comprising:
    receiving an encoded input from a first device over an input bus;
    communicating a decoded value of the encoded input using an output bus comprising a set of output signal lines, wherein each of the output signal lines corresponds with a respective decoded value of the encoded input; and
    toggling at most one of the output signal lines based on the decoded value.

14. The method of claim 13, wherein each of the output signal lines comprises a state, and wherein the state of at most one of the signal lines is changed based on the decoded value at each operation cycle.

15. The method of claim 14, further comprising toggling the state of none of the output signal lines during a respective operation cycle to indicate the decoded value.

16. The method of claim 14, wherein the input bus comprises a set of input signal lines, and wherein the set of output signal lines comprises a larger number of signal lines than the set of input signal lines.

17. The method of claim 14, further comprising outputting the decoded value at each operation cycle.

18. The method of claim 14, wherein the encoded input comprises a base-2 encoding of a value output from the first device.

19. The method of claim 14, further comprising receiving a decoded output, the decoded output allowing selection and output of a set of decoded values.

20. The method of claim 19, wherein the decoded output comprises a decimal value of the encoded input.

21. The method of claim 19, further comprising:
receiving the set of decoded values; and
generating an encoded output based on the set of decoded values.

22. The method of claim 21, further comprising selecting which set of signals to receive using a second device, the second device coupled to a toggle encoder and configured to receive the encoded output.

23. The method of claim 22, wherein the first device is a memory device.

24. The method of claim 22, wherein the second device is a central processing unit.

25. A semiconductor apparatus, comprising:
means for receiving an encoded input from a first device over an input bus;
means for communicating a decoded value of the encoded input using an output bus comprising a set of output signal lines, wherein each of the output signal lines corresponds with a respective decoded value of the encoded input; and
means for toggling at most one of the output signal lines based on the decoded value.

26. The semiconductor apparatus of claim 25, wherein each of the output signal lines comprises a state, and wherein the state of at most one of the output signal lines is changed based on the decoded value at each operation cycle.

27. The semiconductor apparatus of claim 26, wherein an additional decoded value corresponds to the means for toggling toggling the state of none of the output signal lines during a respective operation cycle.

28. The semiconductor apparatus of claim 25, wherein the input bus comprises a set of input signal lines, and wherein the set of output signal lines comprises a larger number of signal lines than the set of input signal lines.

29. The semiconductor apparatus of claim 25, wherein the means for communicating the decoded value is configured to output the decoded value at each operation cycle.

30. The semiconductor apparatus of claim 25, wherein the encoded input comprises a base-2 encoding of a value output from the first device.

31. The semiconductor apparatus of claim 25, further comprising one or more multiplexers configured to receive a decoded output, the decoded output allowing selection and output of a set of decoded values.

32. The semiconductor apparatus of claim 31, wherein the decoded output comprises a decimal value of the encoded input.

33. The semiconductor apparatus of claim 25, further comprising:
means for receiving the set of decoded values; and
means for generating an encoded output based on the set of decoded values.

34. The semiconductor apparatus of claim 33, further comprising a second device coupled to the means for toggling, the second device configured to receive the encoded output and to select which set of signals to receive.

35. The semiconductor apparatus of claim 34, wherein the first device is a memory device.

36. The semiconductor apparatus of claim 34, wherein the second device is a central processing unit.

* * * * *